(12) United States Patent
Sorensen et al.

(10) Patent No.: US 7,570,130 B2
(45) Date of Patent: Aug. 4, 2009

(54) APPARATUS AND METHODS FOR A FIXED IMPEDANCE TRANSFORMATION NETWORK FOR USE IN CONNECTION WITH A PLASMA CHAMBER

(75) Inventors: Carl A. Sorensen, Morgan Hill, CA (US); John M. White, Hayward, CA (US); Suhail Anwar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 756 days.

(21) Appl. No.: 11/179,036

(22) Filed: Jul. 11, 2005

(65) Prior Publication Data

US 2006/0017386 A1    Jan. 26, 2006

Related U.S. Application Data

(60) Provisional application No. 60/587,195, filed on Jul. 12, 2004.

(51) Int. Cl.
*H03H 5/00* (2006.01)
(52) U.S. Cl. ............... 333/32; 315/111.21; 315/111.71
(58) Field of Classification Search ............. 333/32, 333/33, 17.3; 315/58, 71, 111.01, 111.11, 315/111.21, 111.31, 111.41, 111.51, 111.61, 315/111.71, 111.81, 111.91
See application file for complete search history.

(56) References Cited

U.S. PATENT DOCUMENTS 5,815,047 A    9/1998  Sorensen et al.
5,952,896 A    9/1999  Mett et al.
6,016,131 A *  1/2000  Sato et al. .................. 343/895
2006/0027327 A1  2/2006  Sorensen et al.

FOREIGN PATENT DOCUMENTS

EP    1193746 A1    4/2002

(Continued)

OTHER PUBLICATIONS (Application No. 200510113261.5) Office Action dated Jul. 13, 2007.

(Continued)

*Primary Examiner*—Benny Lee
*Assistant Examiner*—Gerald Stevens
(74) *Attorney, Agent, or Firm*—Dugan & Dugan PC

(57) ABSTRACT

In certain embodiments, an apparatus for providing a fixed impedance transformation network for driving a plasma chamber includes a pre-match network adapted to couple between an Active RF match network and a plasma chamber load associated with the plasma chamber. The pre-match network includes (1) a first capacitive element; (2) an inductive element connected in parallel with the first capacitive element to form a parallel circuit that presents a stepped-up impedance to an output of the Active RF match network such that a voltage required to drive the plasma chamber load is reduced; and (3) a second capacitive element coupled to the parallel circuit and adapted to couple to the plasma chamber load. The second capacitive element reduces or cancels at least in part a reactance corresponding to an inductance associated with the plasma chamber load. Numerous other aspects are provided.

29 Claims, 4 Drawing Sheets

FOREIGN PATENT DOCUMENTS

| | | |
|---|---|---|
| JP | 2000-331996 | 11/2000 |
| JP | 2004-095725 | 3/2004 |
| JP | 2004-193567 | 7/2004 |
| JP | 2005-340760 | 12/2005 |
| KR | 2003-0066759 | 8/2003 |
| TW | 0495793 B | 7/2002 |
| TW | 0502264 B | 9/2002 |
| WO | WO02052628 | 7/2002 |

OTHER PUBLICATIONS (Application No. 2005-202144) Office Action dated Sep. 9, 2008.
(Application No. 09123644) Office Action dated Jan. 9, 2008.
(Application No. 200510113260.0) Office Action dated May 11, 2007.
(Application No. 94123646) Office Action dated May 6, 2008.
(Application No. 2005-62758) Office Action dated Jul. 28, 2006.
Office Action from Japanese Patent Application No. P2005-202150 mailed on Jul. 1, 2008.

* cited by examiner

US 7,570,130 B2

APPARATUS AND METHODS FOR A FIXED IMPEDANCE TRANSFORMATION NETWORK FOR USE IN CONNECTION WITH A PLASMA CHAMBER

This application claims priority to U.S. Provisional Patent Application Ser. No. 60/587,195, filed Jul. 12, 2004, and entitled "APPARATUS AND METHODS FOR A LOW INDUCTANCE PLASMA CHAMBER AND/OR A FIXED IMPEDANCE TRANSFORMATION NETWORK FOR USE IN CONNECTION WITH THE SAME", which is hereby incorporated by reference herein in its entirety.

FIELD OF THE INVENTION

The present invention relates to electronic device manufacturing and, more particularly, to apparatus and methods for a fixed impedance transformation network for use in connection with a plasma chamber.

BACKGROUND OF THE INVENTION

Plasma chambers are typically used to process substrates such as semiconductor wafers, glass plates, polymer substrates, etc. A plasma chamber may contain conducting elements which, when energized by a radio frequency (RF) signal, behave like inductors, such as coils or chokes, and/or like capacitors. These "effective" inductances and/or "effective" capacitances, when driven by an RF signal, generate reactance components in the electrical circuit defined by the plasma chamber and its components. These reactance components can substantially increase the electrical impedance associated with the plasma chamber and the amount of voltage needed to drive the same. As a result, plasma chambers can be inefficient and can experience reliability problems.

SUMMARY OF THE INVENTION

In certain embodiments of the invention, an apparatus for providing a fixed impedance transformation network for driving a plasma chamber includes a pre-match network adapted to couple between an Active RF match network and a plasma chamber load associated with the plasma chamber. The pre-match network includes (1) a first capacitive element; (2) an inductive element connected in parallel with the first capacitive element to form a parallel circuit that presents a stepped-up impedance to an output of the Active RF match network such that a voltage required to drive the plasma chamber load is reduced; and (3) a second capacitive element coupled to the parallel circuit and adapted to couple to the plasma chamber load. The second capacitive element reduces or cancels at least in part a reactance corresponding to an inductance associated with the plasma chamber load.

In certain embodiments of the invention, a method for providing a fixed impedance transformation network for driving a plasma chamber includes (1) coupling a pre-match network between an Active RF match network and a plasma chamber load associated with the plasma chamber; (2) at least one of reducing and canceling in part a reactance of the plasma chamber load with a first circuit element of the pre-match network; and (3) stepping up an impedance seen by an output of the Active RF match network with a second circuit element of the pre-match network.

In certain embodiments, an apparatus for providing a fixed impedance transformation network for driving a plasma chamber includes a pre-match network adapted to couple between an Active RF match network and a plasma chamber load associated with the plasma chamber. The pre-match network is adapted to (1) reduce or cancel at least in part a reactance corresponding to an inductance associated with the plasma chamber load; and (2) present a stepped-up impedance to an output of the Active RF match network, such that a voltage required to drive the plasma chamber load is reduced. Numerous other aspects are provided.

Other features and aspects of the present invention will become more fully apparent from the following detailed description, the appended claims and the accompanying drawings.

DETAILED DESCRIPTION

The present invention provides a fixed impedance transformation network or pre-match network for use in connection with an Active RF match network and a plasma chamber so as to (1) increase the impedance seen by the output of the Active RF match network; and/or (2) reduce the amount of voltage needed to drive or power the plasma chamber.

A pre-match network in accordance with the present invention may serve to reduce the reactance component of a plasma chamber load, so as to reduce the phase angle between the voltage and current needed to drive the plasma chamber load and to increase the power factor of the network, thereby resulting in a reduction of the voltage needed to drive the plasma chamber load. The inventive pre-match network also may serve to present a high or "stepped-up" impedance which is seen at the output of an Active RF match network. As a result, the Active RF match circuit can drive the plasma chamber load at a lower voltage. This results in a more efficient and reliable operation of the Active RF match network, and a required operating range of the Active RF match network may be reduced.

Figure 1:
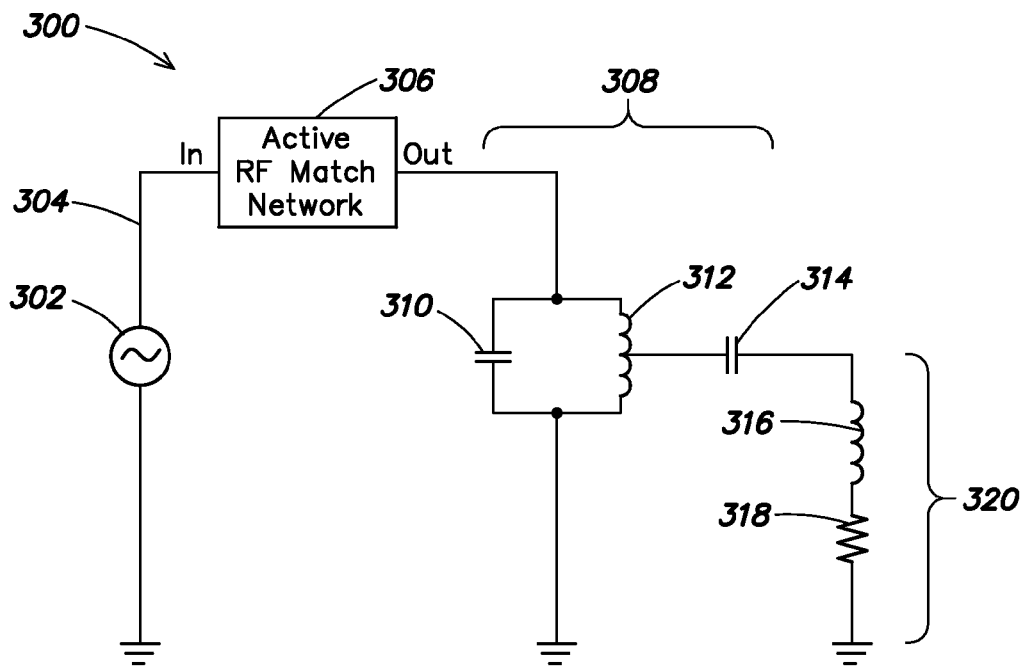
FIG. 1 illustrates an exemplary embodiment of the present invention which provides an impedance transformation network or pre-match network for use in connection with an Active RF match network used for driving a plasma chamber.

FIG. 1 illustrates an exemplary fixed component impedance transformation network or pre-match network in accordance with the present invention. With reference to FIG. 1, the inventive apparatus, which is designated generally by the reference numeral 300, includes an RF signal generator 302, an RF transmission line 304, and an Active RF match network 306. The RF signal generated by the RF signal generator 302 is transmitted via the RF transmission line 304 to the Active RF match network 306.

The RF signal generator 302 can be any suitable RF signal generator adapted to provide an RF signal to a plasma chamber load. The Active RF match network 306 can be any active circuit adapted to provide impedance matching for a plasma chamber load 320 which is associated with a plasma chamber being driven by the apparatus 300 of the present invention. An exemplary Active RF match network is described below with reference to FIG. 2, although any suitable Active RF match network may be employed.

The apparatus 300 also includes a pre-match network 308 which includes a first capacitive element (e.g., a first capacitor 310) shown connected in parallel with an inductive element (e.g., an inductor 312) which, in the exemplary embodiment of FIG. 1, is a tapped choke. In another exemplary embodiment, the inductor 312 may be a coil.

A second capacitive element (e.g., a second capacitor 314) is shown connected in series with the capacitor 310/inductor 312 circuitry and is an output capacitor for the pre-match network 308. The capacitive values of the capacitors 310 and 314 and the inductance value of the inductor 312 can be selected to be any suitable value(s) consistent with providing the desired impedance matching for the apparatus 300 or components of the same (as described further below).

The apparatus 300 also includes an inductor 316, which is the "effective" inductance of a plasma chamber load 320 of a plasma chamber (see, for example, FIG. 3) to which the pre-match network 308 is coupled, and a resistor 318 which is the "effective" resistance of the plasma chamber load 320. The inductor 316 and the resistor 318 are connected in series with the output of the pre-match network 308, as shown.

The plasma chamber load 320 may be the load associated with any plasma chamber with which the apparatus 300 is utilized. In another exemplary embodiment, the plasma chamber load 320 can be any lumped-component plasma chamber load.

The "effective" resistance of the plasma chamber load 320 can include the resistance of a respective plasma body formed in a plasma chamber during the operation and use of the same and/or any other resistance of any of the components of the respective plasma chamber.

As an example, the dimensions of a plasma chamber (not shown) may result in an "effective" inductance or value of inductor 316 having an inductive reactance of approximately 12-15 ohms (inductive) and in an "effective" resistance or value of resistor 318 of approximately 0.3 to 2.0 ohms as described in previously incorporated U.S. Provisional Patent Application Ser. No. 60/587,195, filed Jul. 12, 2004. In such an embodiment, the first capacitor 310 may have a capacitance of about 200 picoFarads, the inductor 312 may have an inductance of about 0.729 microHenries and the second capacitor 314 may have a capacitance of about 1250 picoFarads, although other values may be used.

The pre-match network 308 may be utilized to reduce both the voltage and the current at the output of the Active RF match network 306. For example, the second capacitor 314, when energized by the RF signal provided from the Active RF match network 306, creates a capacitive reactance which serves to cancel in part or reduce the inductive reactance generated by the inductor 316 of the plasma chamber load 320. The reduction of the inductive reactance component of the plasma chamber load results in a reduction in the phase angle $\theta$ between the voltage and current used to drive the plasma chamber load 320 and provides for an increase in the power factor, or the value of the cosine of $\theta$ between the voltage and current, which is required to drive or power the respective plasma chamber load 320.

The pre-match network 308 also serves to increase the impedance of the load seen by the Active RF match network, so as to transform the same into an "improved" load (e.g., via the parallel combination of the first capacitor 310 and inductor 312).

In an exemplary embodiment, the first capacitor 310 can be selected so that it is resonant with the inductor 312 at the selected operating frequency. At the selected operating frequency, which in an exemplary embodiment, is at or approximately at 13.56 MHz, the parallel combination of the first capacitor 310 and the inductor 312 may present a high or "stepped-up" impedance to the output of the Active RF match network 306. This high or "stepped-up" impedance seen at the output of the Active RF match network 306 serves to reduce the amount of voltage needed to drive the respective plasma chamber load 320. The reduction in the voltage needed to drive the respective plasma chamber load 320 provides for a more efficient and reliable operation of the Active RF match network 306.

In an exemplary embodiment, the components of the pre-match network 308 (e.g., first capacitor 310, second capacitor 314 and/or inductor 312) can be selected to provide an impedance step-up ratio of about 3:1. In another exemplary embodiment, the components of the pre-match network 308 can be selected to provide an impedance step-up ratio of about 4:1. For example, the inductor 312 may boost the real part of the impedance (via the location of the tap) and the second capacitor 314 may keep the imaginary part of the impedance from becoming too high. In this manner, the pre-match network 308 may place the impedance seen by the Active RF match network 306 within a normal or expected range for proper operation of the Active RF match network 306.

The foregoing description discloses only exemplary embodiments of the invention. Modifications of the above disclosed apparatus and method which fall within the scope of the invention will be readily apparent to those of ordinary skill in the art. For instance, in another exemplary embodiment, the Active RF match network 306 can be designed so that the components of the pre-match network 308 are integrated with or into the same.

Figure 2:
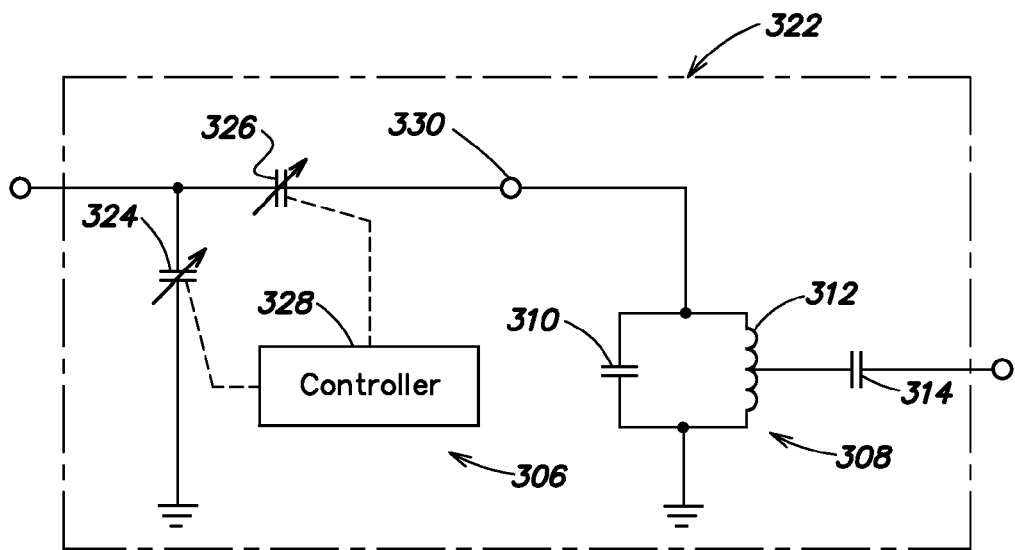
FIG. 2 illustrates an exemplary embodiment of an integrated Active RF match/pre-match network provided in accordance with the present invention.

FIG. 2 illustrates such an exemplary embodiment of an integrated Active RF match/pre-match network 322. The integrated match network 322 includes the Active RF match network 306 coupled to the pre-match network 308 as shown. In the exemplary embodiment of FIG. 2, the Active RF match network 306 includes a tunable shunt capacitor 324 and a tunable series capacitor 326. A controller 328 is coupled to each tunable capacitor 324, 326 and may periodically sample the load impedance seen by the Active RF match network 306 (e.g., at node 330) and adjust the tunable capacitors 324, 326 based on variations in load impedance. For example, the controller 328 may adjust for changes in load impedance every tenth of a second, or at some other time interval. Because the Active RF match network 306 may have a limited range of operation, the pre-match network 308 may be employed to place the load impedance within the Active RF match network 306's range of operation.

Figure 3:
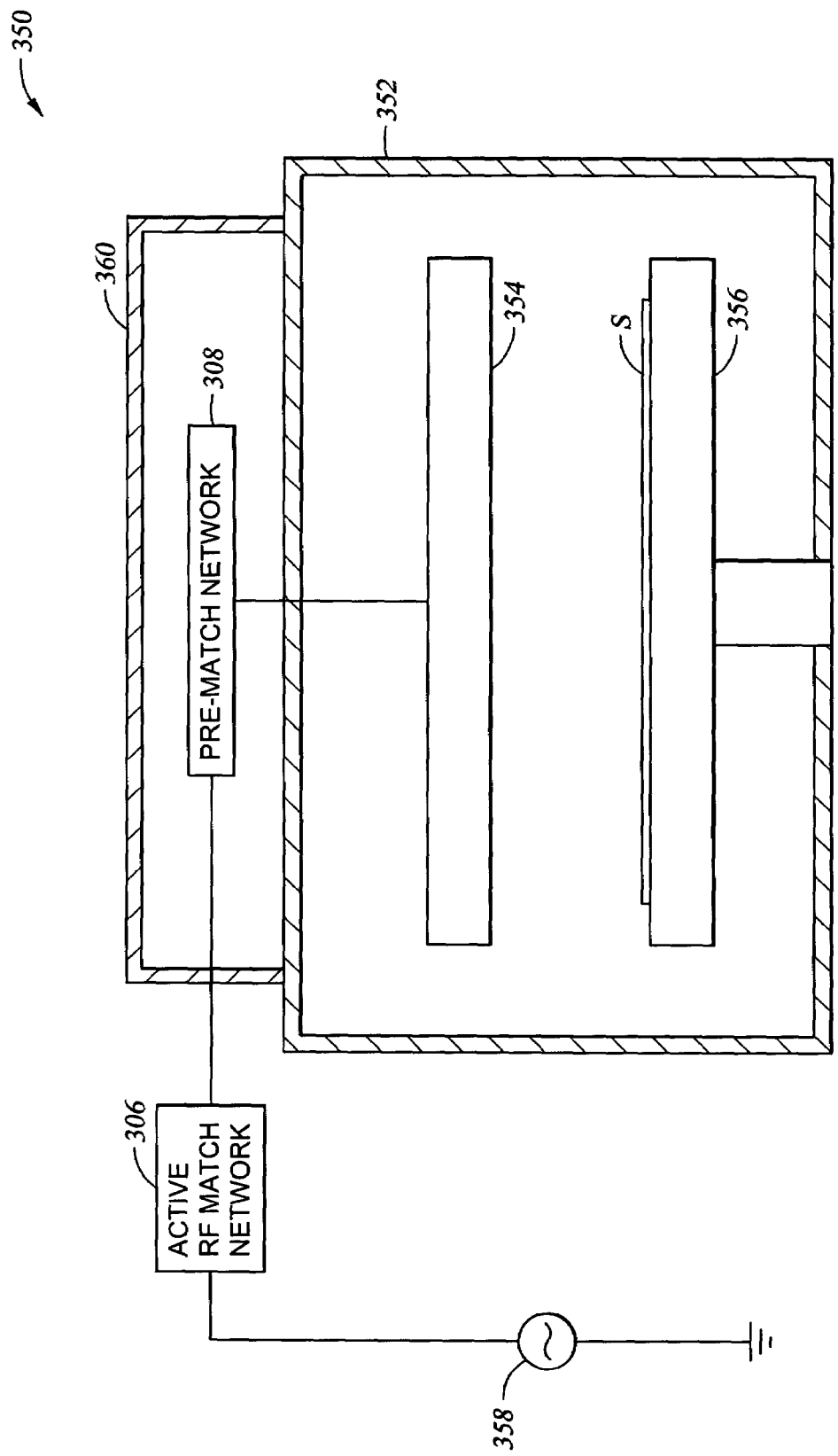
FIG. 3 illustrates a first exemplary plasma processing system provided in accordance with the present invention.

FIG. 3 illustrates a first exemplary plasma processing system 350 provided in accordance with the present invention. With reference to FIG. 3, the first processing system 350 includes a plasma chamber 352 that includes a shower head 354 spaced apart from a substrate support 356 by a predetermined distance. The substrate support 356 is adapted to support a substrate S during processing within the plasma chamber 352. RF power may be delivered to the plasma chamber 352 via an RF power source 358 and through use of the Active RF match network 306 and the pre-match network 308 (described previously). An RF cover box 360, such as a Faraday cage, may be employed to prevent undesired dissemination of radiation during RF power delivery to the plasma chamber 352 (e.g., 20-25 kW in certain embodiments, although other power ranges may be used).

Figure 4:
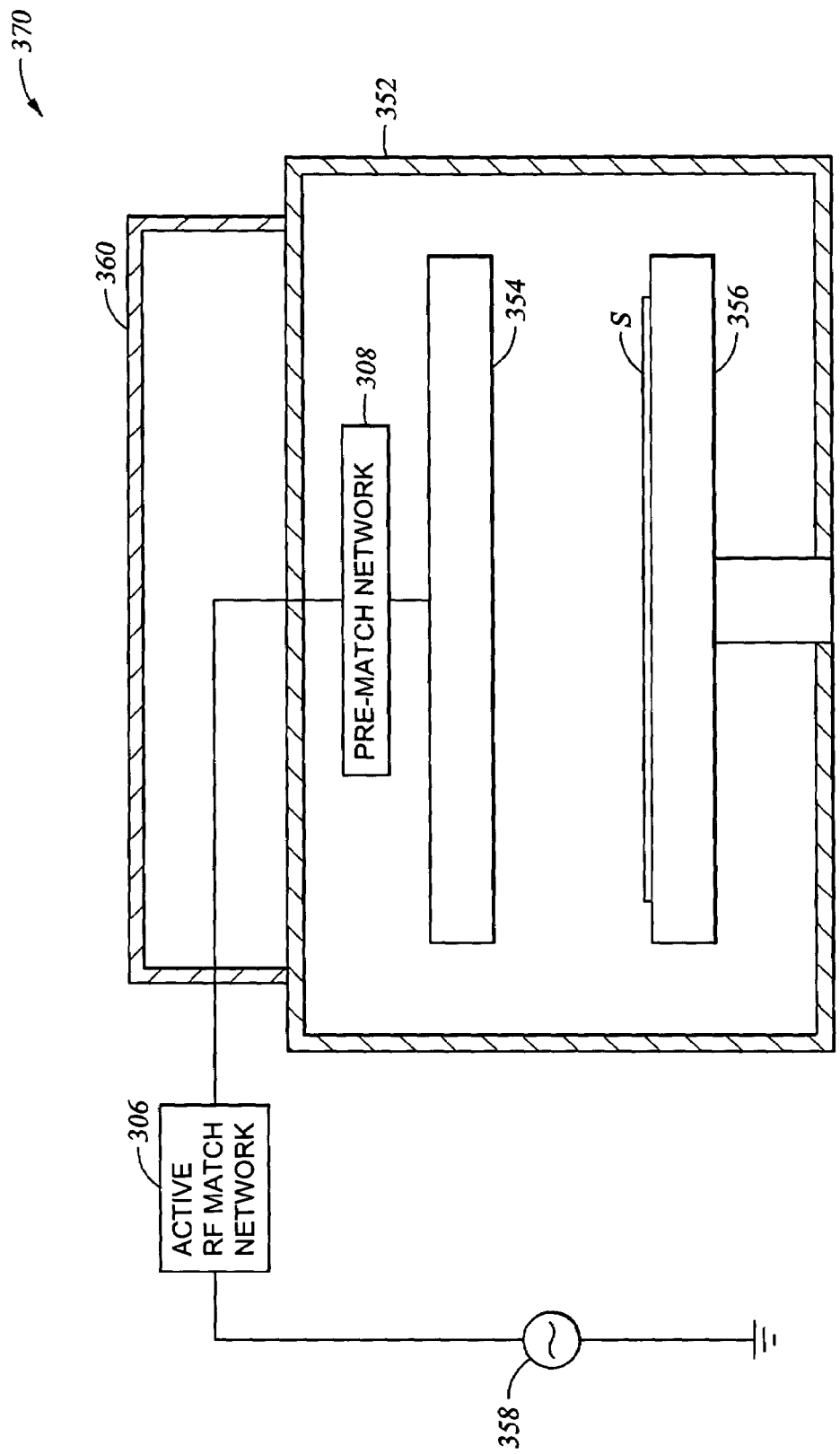
FIG. 4 illustrates a second exemplary plasma processing system provided in accordance with the present invention.
Figure 5:
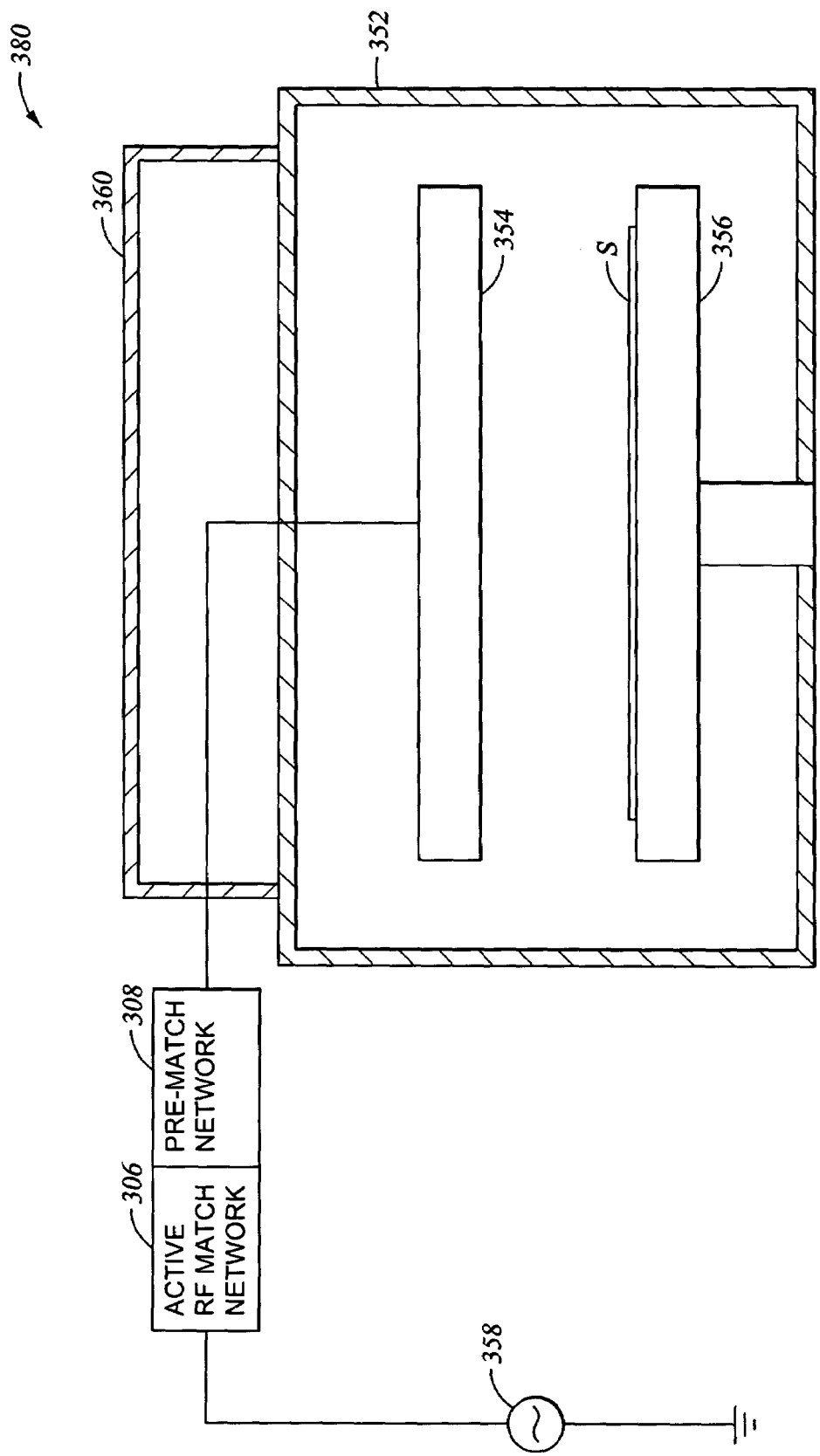
FIG. 5 illustrates a third exemplary plasma processing system provided in accordance with the present invention.

A plasma may be generated within the plasma chamber 352 by flowing an appropriate gas into the plasma chamber 352 (via the shower head 354), and by delivering RF power to the shower head 354 via the RF power source 358, the Active RF match network 306 and the pre-match network 308. In the embodiment shown in FIG. 3, the pre-match network is located within the RF cover box 360. It will be understood that the pre-match network 308 may be otherwise located. For example, FIG. 4 illustrates a second exemplary plasma processing system 370 provided in accordance with the present invention in which the pre-match network 308 is located within the plasma chamber 352. FIG. 5 illustrates a third exemplary plasma processing system 380 provided in accordance with the present invention in which the pre-match network 308 is located within or integrated with the active RF match network 306.

Accordingly, while the present invention has been disclosed in connection with exemplary embodiments thereof, it should be understood that other embodiments may fall within the spirit and scope of the invention, as defined by the following claims.

The invention claimed is:

1. An apparatus for providing a fixed impedance transformation network for driving a plasma chamber, comprising:
a pre-match network adapted to couple between an Active RF match network and a plasma chamber load associated with the plasma chamber, wherein the pre-match network comprises:
a first capacitive element;
an inductive element including a tapped choke, the inductive element connected in parallel with the first capacitive element to form a parallel circuit that presents a stepped-up impedance to an output of the Active RF match network such that a voltage required to drive the plasma chamber load is reduced; and
a second capacitive element coupled to the parallel circuit and adapted to couple to the plasma chamber load, wherein the second capacitive element reduces or cancels at least in part a reactance corresponding to an inductance associated with the plasma chamber load.

2. The apparatus of claim 1, wherein at least one of the first capacitive element and the second capacitive element includes a capacitor.

3. The apparatus of claim 1, wherein the inductive element further includes a coil.

4. The apparatus of claim 1, wherein the pre-match network provides an impedance step-up ratio of about 3:1.

5. The apparatus of claim 1, wherein the pre-match network provides an impedance step-up ratio of about 4:1.

6. The apparatus of claim 1, wherein the pre-match network is integrated with or into the Active RF match network.

7. The apparatus of claim 1, wherein the pre-match network is integrated with or into the plasma chamber.

8. The apparatus of claim 1, wherein the pre-match network is integrated with or into an RF delivery box associated with the plasma chamber.

9. A method for providing a fixed impedance transformation network for driving a plasma chamber, comprising:
providing a pre-match network comprising:
a first circuit element comprising a first capacitive element and an inductive element including a tapped choke, the inductive element connected in parallel with the first capacitive element to form a parallel circuit; and
a second circuit element comprising a second capacitive element coupled to the parallel circuit;
coupling the pre-match network between an Active RF match network and a plasma chamber load associated with the plasma chamber;
at least one of reducing and canceling in part a reactance of the plasma chamber load with the second circuit element of the pre-match network; and
stepping up an impedance seen by an output of the Active RF match network with the first circuit element of the pre-match network.

10. The method of claim 9, further comprising:
integrating the pre-match network with or into the Active RF match network.

11. The method of claim 9, further comprising:
integrating the pre-match network with or into the plasma chamber.

12. The method of claim 9, further comprising:
integrating the pre-match network with or into an RF delivery box associated with the plasma chamber.

13. An apparatus for providing a fixed impedance transformation network for driving a plasma chamber, comprising:
a pre-match network adapted to couple between an Active RF match network and a plasma chamber load associated with the plasma chamber, the pre-match network comprising:
a first capacitive element;
an inductive element including a tapped choke and connected in parallel with the first capacitive element to form a parallel circuit; and
a second capacitive element coupled to the parallel circuit and adapted to couple to the plasma chamber load, wherein the pre-match network is adapted to:
reduce or cancel at least in part a reactance corresponding to an inductance associated with the plasma chamber load; and
present a stepped-up impedance to an output of the Active RF match network, such that a voltage required to drive the plasma chamber load is reduced.

14. The apparatus of claim 13, wherein at least one of the first capacitive element and the second capacitive element includes a capacitor.

15. The apparatus of claim 13, wherein the inductive element further includes a coil.

16. The apparatus of claim 13, wherein the pre-match network provides an impedance step-up ratio of about 3:1.

17. The apparatus of claim 13, wherein the pre-match network provides an impedance step-up ratio of about 4:1.

18. The apparatus of claim 13, wherein the pre-match network is integrated with or into the Active RF match network.

19. The apparatus of claim 13, wherein the pre-match network is integrated with or into the plasma chamber.

20. The apparatus of claim 13, wherein the pre-match network is integrated with or into an RF delivery box associated with the plasma chamber.

21. A system comprising:
an RF power source;
an Active RF match network coupled to the RF power source and adapted to receive an RF signal from the RF power source;
a plasma chamber having a plasma chamber load; and
a pre-match network coupled between the Active RF match network and the plasma chamber load, wherein the pre-match network comprises:
a first capacitive element;
an inductive element including a tapped choke connected in parallel with the first capacitive element to form a parallel circuit; and a second capacitive element coupled to the parallel circuit and adapted to couple to the plasma chamber load,
wherein the pre-match network is adapted to:
reduce or cancel at least in part a reactance corresponding to an inductance associated with the plasma chamber load; and
present a stepped-up impedance to an output of the Active RF match network, such that a voltage required to drive the plasma chamber load is reduced.

22. The system of claim 21, wherein at least one of the first capacitive element and the second capacitive element includes a capacitor.

23. The system of claim 21, wherein the inductive element further includes a coil.

24. The system of claim 21, wherein the pre-match network provides an impedance step-up ratio of about 3:1.

25. The system of claim 21, wherein the pre-match network provides an impedance step-up ratio of about 4:1.

26. The system of claim 21, wherein the pre-match network is integrated with or into the Active RF match network.

27. The system of claim 21, wherein the pre-match network is integrated with or into the plasma chamber.

28. The system of claim 21, wherein the pre-match network is integrated with or into an RF delivery box associated with the plasma chamber.

29. A method for providing a fixed impedance transformation network for driving a plasma chamber, comprising:
coupling a pre-match network between an Active RF match network and a plasma chamber load associated with the plasma chamber;
at least one of reducing and canceling in part a reactance of the plasma chamber load with a first circuit element of the pre-match network;
stepping up an impedance seen by an output of the Active RF match network with a second circuit element of the pre-match network; and
integrating the pre-match network with or into the Active RF match network.

* * * * *